(12) United States Patent
McDonald

(10) Patent No.: US 6,169,491 B1
(45) Date of Patent: Jan. 2, 2001

(54) MULTIPORT POWER MONITOR

(75) Inventor: Thomas M. McDonald, Monroe, CT (US)

(73) Assignee: Hubbell Incorporated, Orange, CT (US)

(*) Notice: Under 35 U.S.C. 154(b), the term of this patent shall be extended for 0 days.

(21) Appl. No.: 09/409,259

(22) Filed: Sep. 30, 1999

(51) Int. Cl.[7] .................................................. G08B 5/00
(52) U.S. Cl. ......................................... 340/815.4; 340/635
(58) Field of Search ............................... 340/815.4, 635; 362/800

(56) References Cited

U.S. PATENT DOCUMENTS

| | | | |
|---|---|---|---|
| 4,194,181 | * 3/1980 | Brundage | 340/286 R |
| 4,354,182 | * 10/1982 | Frey | 340/650 |
| 5,109,200 | * 4/1992 | Dushane et al. | 324/508 |

OTHER PUBLICATIONS

Brad Harrison, Designer's Guide, pp. 86 and 130.
NEC, High Isolation Voltage AC Input, Darlington Transitor Type Multi Photocoupler Series, pp. 1–42 and 1–43.
Application of AC Input Compatible Photocoupler, pp. 5–33 and 5–34.

* cited by examiner

*Primary Examiner*—Julie Lieu
(74) *Attorney, Agent, or Firm*—John E. Holmes; Alfred N. Goodman

(57) ABSTRACT

A multi-port power monitor is provided which indicates whether power is being supplied to one or more of a plurality of ports connected to external devices. The multi-port power monitor comprises a plurality of serially connected indicators and a plurality of controllable switches which supply power to the individual indicators when one or more of the corresponding ports are active. Because the indicators are connected in series, rather than in parallel, the same current passes through each illuminated indicator thereby avoiding the need for a large power resistor or a large AC capacitor for each individual port

15 Claims, 3 Drawing Sheets

MULTIPORT POWER MONITOR

FIELD OF THE INVENTION

The present invention relates to a multi-port power monitor for indicating whether power is being provided to one or more ports through which power is provided to external devices connected to the ports. More particularly, the present invention is directed to a power monitor comprising a plurality of controllable switches for providing power to one or more of a plurality of indicators when power is provided to one or more of a plurality of ports.

BACKGROUND OF THE INVENTION

Multi-port units are used in machine controls to provide power to controllable devices on an assembly line. In particular, a controller transmits a control signal to provide power through a power port to an external controllable device. Typically, a monitor circuit is connected in parallel with the power port in order to indicate whether power is being properly supplied to the power port to which the external device is connected. As shown in FIG. 1, a conventional monitor circuit 10 for indicating whether power is being provided through a power port (not shown) to an external device (not shown) comprises a light emitting diode (LED) 1, a diode 2, an alternating current (AC) power source 3, a capacitor 4 and a resistor 5. However, the capacitor occupies a large amount of valuable space. Further, in the case of multiple ports, a separate monitor circuit is required for each port with the respective LEDs indicating the power supply status for each port connected in parallel. As a result, a large aggregate current is required in order to simultaneously illuminate the LEDs. For example, in the case of eight ports with eight corresponding monitor circuits, resulting a total of eight LEDs each requiring 5 mA for illumination, a total current of 40 mA is required to simultaneously illuminate an eight LEDs.

Accordingly, it is an object of the present invention to provide a multi-port monitor with reduced power and space requirements.

SUMMARY OF THE INVENTION

According to the present invention, a multi-port power monitor is provided which indicates whether power is being supplied to one or more of a plurality of ports connected to external devices. The multi-port power monitor comprises a plurality of serially connected indicators and a plurality of controllable switches which supply power to the individual indicators when one or more of the corresponding ports are active. Because the indicators are connected in series, rather than in parallel, the same current passes through each illuminated indicator thereby avoiding the need for a large power resistor or a large AC capacitor for each individual port.

BRIEF DESCRIPTION OF THE DRAWINGS

Preferred embodiments of the present invention are described in detail below with reference to the attached drawing figures, in which.

DETAILED DESCRIPTION OF THE PREFERRED EMBODIMENTS

Figure 1:
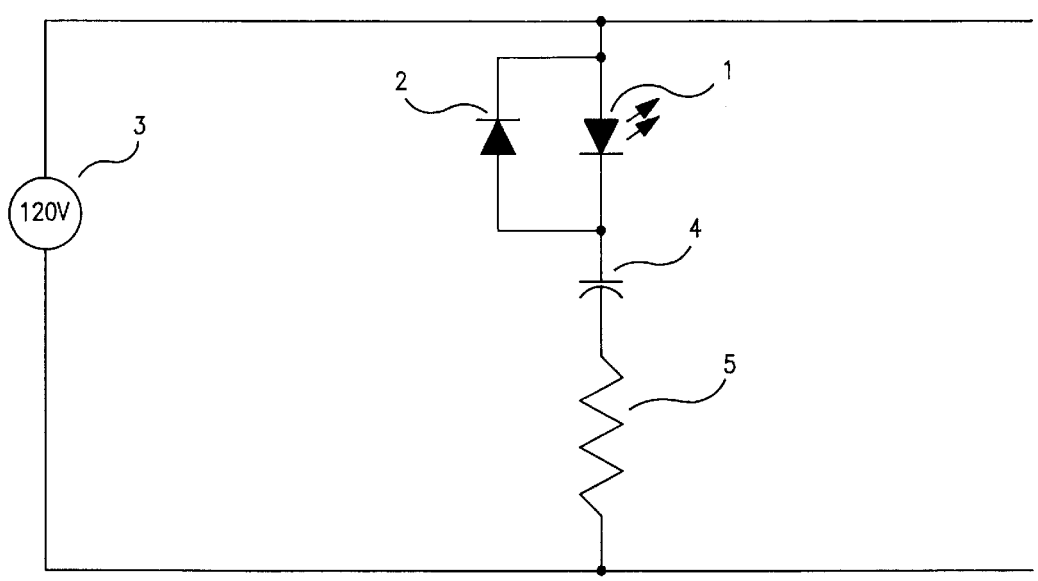
FIG. 1 is a circuit diagram illustrating a conventional power monitor circuit.
Figure 2:
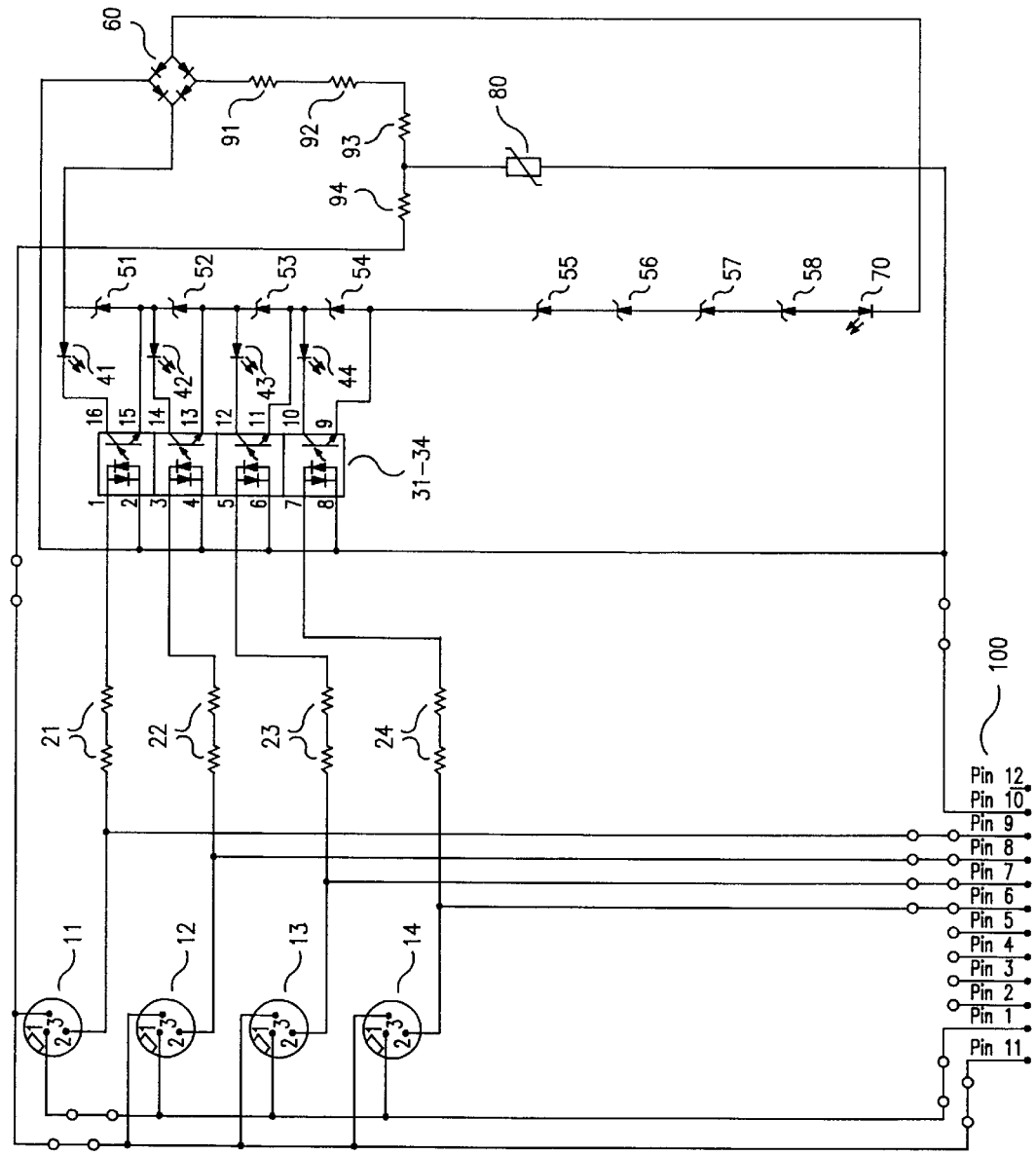
FIG. 2 is a circuit diagram illustrating a power monitor circuit in accordance with a first embodiment of the present invention.

With reference to FIG. 2, the monitor circuit of a preferred embodiment of the present invention will be described for a four port assembly. The monitor circuit comprises AC input compatible photocouplers (optical couplers) 31–34, LEDs 41–44 which indicate whether ports 11–14 are active, an LED 70 which indicates whether the monitor circuit as a whole is operating, zener diodes 51–58, a rectifier bridge 60, and resistors (resistive elements) 21–24 and 91–94 for limiting power. Ports 11–14 are receptive to a three-wire plug or jack assembly (not shown) through which power is supplied to an external device. A twelve pin connector 100 provides AC power (120 volts) to the monitor circuit and the respective ports 11–14. That is, pins 1–4 of the connector 100 provide A/C power to the respective ports 11–14 while pin 11 of the connector provides AC power to the monitor circuit. Further, each of the ports 11–14 comprises a first terminal which receives a common ground from pin 9 of the connector 100, a second terminal which receives AC power from one of pins 1–4 of the connector, and a third terminal which connected to pin 11 of the terminal which provides common AC return for the ports 11–14. The second terminals of the ports 11–14 are respectively connected to the photocouplers 31–34 through the resistors 21–24. The zener diodes 51–58 and the LED 70 are connected in series between the positive and negative output terminals of the rectifying bridge 60. The LED 70 indicates whether the monitor circuit as a whole is in an "on" or "off" operating state.

The AC input compatible photocouplers 31–34 incorporate an input circuit comprising two internal LEDs and an output circuit comprising a phototransistor. The two LEDs are connected in reverse parallel so that when the positive and negative polarities of the AC input signal are changed, either of the two LEDs emits light so that a full-wave rectified output signal is generated by the phototransistor. Further, the photocouplers 31–34 provide a current amplification or gain which is typically on the order of two or more times the input current. An example of a photocoupler which may be used in the preferred embodiment is a PS2505-1 photocoupler manufactured by NEC Corporation.

In operation, the photocouplers 31–34 function as controllable switches to illuminate the corresponding LEDs 41–44. In particular, when power is supplied to one or more of the ports 11–14 through pins 1–4 of the connector 100, power is also supplied to the corresponding photocoupler(s) through resistors 21–24. As a result, the photocoupler is turned on so that a current required to illuminate the LED is conducted through the LED and bypassed or diverted from the zener diode connected the LED. For example, when the port 11 is active, the photocoupler 31 is turned on, providing a conductive path through LED 41 which diverts the current necessary to illuminate the LED from the zener diode 51 and illuminates the LED 41. When power is not supplied to the ports 11–14, current bypasses the corresponding LEDs 41–44 and passes through the corresponding zener diodes 51–54.

An important feature of the monitor circuit of FIG. 2 resides in the serial connection of the LEDs 41–44 through the photocouplers 31–34. The zener diodes 51–54 permit the LEDs 41–44 to be connected in series by selectively bypassing current flow from the individual LEDs 41–44 when power is not supplied to the corresponding ports 11–14. Because the LEDs 41–44 are connected in series, rather than in parallel, the current required to simultaneously illuminate two or more of the LEDs 41–44 is equal to the current required to illuminate any single one of the LEDs 41–44. Thus, if 5 mA is required to illuminate any one LED, then only 5 mA are required to simultaneously illuminate all four of the LEDs rather than 20 mA.

In addition to the series resistors 91–94 and resistors 21–24 which serve to limit the power supplied to the rectifier bridge 60 and the photocouplers 31–34, respectively, a metal oxide varistor (MOV) 80 is connected to the rectifier bridge 60 to provide power surge protection. Although the four port monitor circuit requires only four zener diodes (i.e., one for each port), each connected to one of the LEDs 41–44 and one of the optical couplers 31–34 to cause the LEDs 41–44 to emit light when power is provided to the ports 11–14, additional zener diodes 5558 are provided for current control purposes.

In the preferred embodiment, the rectifier bridge 60 is a full-wave rectifier bridge. However, it should be noted that a half-wave rectifier may be used in place of the full-wave rectifier bridge without affecting operation of the monitor circuit. Similarly, one of ordinary skill in the art will recognize that the AC input compatible photocouplers 31–34 may be replaced with DC input compatible or one-direction input photocouplers (i.e., only one LED is used in the input circuit of the photocoupler) and a diode bridge or CR circuit which full- or half-wave rectifies the AC input signal. Further, transformers may be used as controllable switches in place of the photocouplers.

Figure 3:
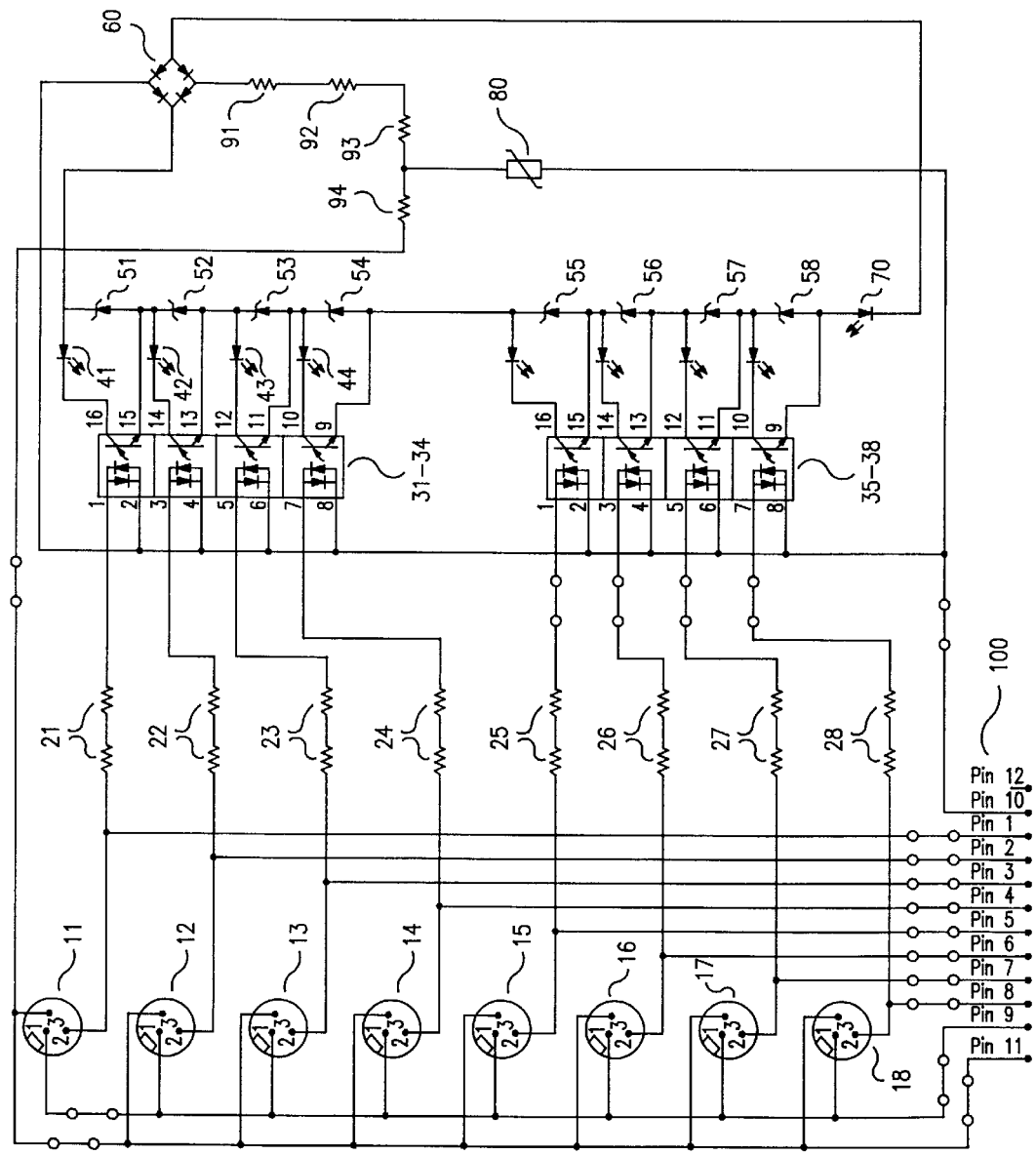
FIG. 3 is a circuit diagram illustrating a power monitor circuit in accordance with a second embodiment of the present invention.

FIG. 3 illustrates a second embodiment of the present invention for an eight port assembly wherein similar elements used in the embodiment of FIG. 2 are designated with the same reference numerals. The monitor circuit comprises AC input compatible photocouplers 31–38, LEDs 41–48 which indicate whether ports 11–18 are active, an LED 70 which indicates whether the monitor circuit as a whole is operating, zener diodes 51–58, a rectifier bridge 60, and resistors (resistive elements) 21–24 and 91–94 for limiting power. The monitor circuit of FIG. 3 operates in the same manner as that of FIG. 2, with the exception that zener diodes 55–58 are utilized to bypass the additional LEDs 45–48 when power is not supplied to ports 15–18.

Although the present invention has been shown and described with respect to preferred embodiments, various changes and modifications within the scope of the invention will readily occur to those skilled in the art. For example, although the multi-port monitor of present invention is particularly useful for multiple AC power ports, its application is not limited thereto and it may be used with DC power ports as well.

What is claimed is:

1. A multi-port monitor for indicating that power is being supplied to one or more of a plurality of power ports, said multi-port monitor comprising:
   a plurality of indicators serially connected to each other, each of said indicators corresponding to one of said power ports and providing an indication when power is being supplied to said corresponding one of said power ports; and
   a plurality of controllable switches each corresponding to and controlled by one of said power ports and providing a supply voltage to one of said indicators to illuminate said one of said indicators when power is supplied to said corresponding one of said power ports.

2. The multi-port monitor according to claim 1, wherein each of said controllable switches comprises a photocoupler.

3. The multi-port monitor according to claim 2, further comprising a plurality of zener diodes connected in parallel with said controllable switches.

4. The multi-port monitor according to claim 1, wherein each of said indicators comprises a light emitting diode (LED).

5. The multi-port monitor according to claim 1, further comprising a surge protection device connected to said rectifier.

6. The multi-port monitor according to claim 5, wherein said surge protector comprises a varistor.

7. The multi-port monitor according to claim 1, further comprising a rectifier connected to said indicators for generating said supply voltage which is supplied to said indicators by said controllable switches.

8. The multi-port monitor according to claim 7, wherein said rectifier comprises a full-wave rectifier bridge.

9. A monitor device for monitoring a plurality of ports through which power is provided to a plurality external devices and providing an indication when power is supplied to one or more of said ports, said monitor device comprising:
   a power supply for generating a supply voltage;
   a plurality of indicators for providing an indication that power is being supplied to a corresponding one of said ports; and
   a plurality of controllable switches connected to said power ports and said power supply, wherein said indicators are serially connected to each other through said controllable switches and each of said controllable switches corresponds to and is controlled by one of said ports and provides said supply voltage from said power supply to one of said indicators to illuminate said one of said indicators when power is supplied to said corresponding one of said ports.

10. The monitoring device according to claim 9, wherein each of said controllable switches comprises a photocoupler connected to said indicator and a zener diode connected in parallel to said indicator and said optical coupler.

11. A monitor device for monitoring a plurality of ports through which power is provided to a plurality external devices and providing an indication when power is supplied to one or more of said ports, said monitor device comprising:
   an power supply for generating an AC voltage;
   a rectifying circuit for receiving said supply voltage from said power supply and generating a rectified voltage;
   a plurality of light emitting diodes (LEDs) for providing an indication that power is being supplied to at least one of said power ports, said indicators being serially connected to each other and said rectifier;
   a plurality of zener diodes connected to said rectifying circuit and said LEDs; and
   a plurality of controllable switches connected to said LEDs for illuminating said LEDs when power is supplied to said power ports, each of said controllable switches comprising a photocoupler serially connected to one of said LEDs, wherein an amount of current which is required to illuminate said LEDs is permitted to pass through one of said zener diodes and to bypass a corresponding one of said LEDs when power is not supplied to a corresponding one of said ports and said amount of current which is required to illuminate said LEDs is permitted to pass through said one of said LEDs and to bypass said one of zener diodes when power is supplied to one of said ports so that said one of said LEDs is illuminated.

12. A method for selectively providing an indication that one or more of a plurality of ports is receiving power using a monitor circuit comprising a plurality of serially connected indicators and a plurality of controllable switches connected to said indicators and said ports, said method comprising the steps of:

supplying power to one of said ports;

providing a conductive path through a corresponding one of said indicators by activating one of said controllable switches corresponding to said one of said ports in response to power being supplied to said one of said ports; and providing an amount of current which is required to illuminate said indicators to said one of said indicators through said conductive path so that said one of said indicators emits light when said power is provided to said one of said ports.

13. The method according to claim 12, further comprising the step of bypassing said amount of current which is required to illuminate said indicators from another one of said indicators by deactivating another one of said controllable switches corresponding to another one of said ports when power is not supplied to said another one of said ports so that said another one of said indicators does not emit light.

14. A method for selectively providing an indication that one or more of a plurality of ports is receiving power using a monitor circuit comprising a plurality of indicators and a plurality of controllable switches alternately connected in series with each other and a plurality of zener diodes connected to said controllable switches and said indicators, said method comprising the steps of:

conducting an amount of current which is required to illuminate said LEDs through one of said zener diodes so that said amount of current which is required to illuminate said LEDs bypasses a corresponding one of said LEDs and said corresponding one said LEDs does not emit light when power is not supplied to a corresponding one of said ports; and conducting said amount of current which is required to illuminate said LEDs through said corresponding one of said LEDs so that said amount of current which is required to illuminate said LEDs bypasses said one of zener diodes and said corresponding one of said LEDs emits light when power is supplied to said one of said ports.

15. A method for selectively illuminating one of a plurality of light emitting diodes (LEDs) using a plurality of photocouplers alternately connected in series with said LEDs and a plurality of zener diodes connected to said LEDs and said photocouplers, the method comprising the steps of:

permitting an amount of current which is required to illuminate said LEDs to pass through one of said LEDs and to bypass a corresponding one of said zener diodes so that said one of said LEDs emits light when an input voltage signal is applied to a corresponding one of said photocouplers to thereby establish conductive path through said corresponding one of said photocouplers; and permitting said amount of current which is required to illuminate said LEDs to bypass said one of said LEDs and to pass through said corresponding one of said zener diodes so that said one of said LEDs does not emit light when said input voltage signal is not applied to said photocoupler.

* * * * *